(12) United States Patent
Fujii

(10) Patent No.: US 8,216,921 B2
(45) Date of Patent: Jul. 10, 2012

(54) METHOD FOR PRODUCTION OF SILICON WAFER FOR EPITAXIAL SUBSTRATE AND METHOD FOR PRODUCTION OF EPITAXIAL SUBSTRATE

(75) Inventor: Tatsuo Fujii, Shunan (JP)

(73) Assignee: Covalent Materials Corporation, Shunan-shi (JP)

( * ) Notice: Subject to any disclaimer, the term of this patent is extended or adjusted under 35 U.S.C. 154(b) by 0 days.

(21) Appl. No.: 12/560,847

(22) Filed: Sep. 16, 2009

(65) Prior Publication Data

US 2010/0093156 A1 Apr. 15, 2010

(30) Foreign Application Priority Data

Sep. 19, 2008 (JP) .................. 2008-241191
Mar. 9, 2009 (JP) .................. 2009-055442

(51) Int. Cl.
*H01L 21/20* (2006.01)
*H01L 21/36* (2006.01)

(52) U.S. Cl. ........ 438/509; 438/503; 438/505; 438/507; 438/508

(58) Field of Classification Search .................. 438/503, 438/505, 507–509
See application file for complete search history.

(56) References Cited

U.S. PATENT DOCUMENTS

| 4,153,486 | A | * | 5/1979 | Srinivasan | 117/97 |
| 4,622,082 | A | * | 11/1986 | Dyson et al. | 438/471 |
| 6,013,564 | A | | 1/2000 | Muramatsu | |
| 6,162,708 | A | * | 12/2000 | Tamatsuka et al. | 438/503 |
| 2001/0037761 | A1 | * | 11/2001 | Ries et al. | 117/200 |
| 2006/0156970 | A1 | * | 7/2006 | Dong-Suk et al. | 117/97 |

FOREIGN PATENT DOCUMENTS

| JP | 9-199380 A | 7/1997 |
| JP | 10-106955 A | 4/1998 |

* cited by examiner

*Primary Examiner* — Bac Au
(74) *Attorney, Agent, or Firm* — Foley & Lardner LLP

(57) ABSTRACT

A method for producing a silicon wafer for epitaxial substrate which includes a first step of performing thermal oxidization on a silicon wafer containing boron atoms no less than 1E19 atoms/cm$^3$, thereby forming a silicon oxide film on the surface of the silicon wafer, a second step of peeling off the silicon oxide film, and a third step of performing heat treatment on the silicon wafer in a hydrogen atmosphere.

10 Claims, 4 Drawing Sheets

METHOD FOR PRODUCTION OF SILICON WAFER FOR EPITAXIAL SUBSTRATE AND METHOD FOR PRODUCTION OF EPITAXIAL SUBSTRATE

CROSS-REFERENCE TO RELATED APPLICATIONS

The present application is based upon and claims the benefit from prior Japanese Application Nos. 2009-055442 filed Mar. 9, 2009 and 2008-241191, filed Sep. 19, 2008, the entire contents of which are incorporated herein by reference.

BACKGROUND OF THE INVENTION

1. Field of the Invention

The present invention relates to a method for producing a silicon wafer to be used for production of semiconductor devices and, more particularly, to a method for producing a silicon wafer for epitaxial substrates and a method for producing an epitaxial substrate.

2. Description of the Related Art

Recent years have seen a remarkable improvement in the performance of semiconductor devices. High-performance semiconductor devices need a high-quality silicon substrate (or silicon wafer). Better quality is especially required of epitaxial substrates to be used for production of advanced discrete devices represented by power MOSFET. In general, discrete devices are designed such that current flows in the direction from the front side to the reverse side of the silicon wafer. This requires that current in the forward direction should increase according as devices improve in performance. To meet this requirement, it is necessary to reduce resistance components and hence to increase the concentration of impurities in epitaxial substrates.

Production of epitaxial substrates employs epitaxial growth process, which is one kind of vapor phase growth process. This process starts with preparing a silicon wafer for epitaxial substrate by highly doping an impurity, such as boron (B), up to about $1E19$ atoms/cm$^3$. (This silicon wafer will be referred to as a silicon wafer for substrate hereinafter.) The silicon wafer for substrate is placed in a reaction furnace in which the atmosphere is kept at a predetermined pressure. It is then heated in the reaction furnace which is being fed with a source gas incorporated with a dopant gas containing phosphorus (P) or boron (B) as an impurity. The heating temperature is 1000° C. or above. This heating causes the source gas to undergo thermal decomposition or hydrogen reduction on the surface of the silicon wafer for substrate. This reaction causes a silicon single-crystal film, which is 1 to 200 μm thick and contains an impurity in a concentration of about $1E14$ to $1E17$ atoms/cm$^3$, to grow on the surface of the silicon wafer for substrate.

The thus produced epitaxial substrate is used to form desired devices thereon. In this way there is obtained the high-performance discrete device mentioned above.

The disadvantage of the epitaxial growth method that is applied to a highly doped silicon wafer for substrate is that the profile of impurity concentration is poor or the in-plane uniformity of impurity concentration is poor due to autodoping into the single-crystal silicon film to be grown.

Autodoping denotes a phenomenon that when the silicon wafer for substrate is heated at the time of epitaxial growth, boron diffuses outward into the atmosphere from the surface of the silicon wafer for substrate and diffused boron is captured by the single-crystal silicon film which is growing so that the concentration of impurity fluctuates. The consequence is that the profile of impurity in the epitaxial substrate is uneven, which presents difficulties in forming the semiconductor devices with desired characteristics.

Thus, several methods have been proposed to prevent autodoping. One of them consists of previously forming a silicon oxide film by CVD (Chemical Vapor Deposition) on the reverse side of the silicon wafer for substrate, thereby preventing the impurity from diffusing outward. (See Japanese Patent Unexamined Publication No. 10-106955.) Another is intended to perform hydrogen treatment on the highly boron-doped silicon wafer for substrate, thereby reducing the boron concentration in the surface layer. (See Japanese Patent Unexamined Publication No. 9-199380.)

Unfortunately, the known methods mentioned above have some problems. For example, as shown in Japanese Patent Unexamined Publication No. 10-106955, the first one causes anomalous silicon growth to occur on the silicon oxide film at the bevel part when epitaxial growth is performed on the silicon wafer for substrate, with its reverse side coated with a silicon oxide film extending to the bevel part. As the result, the silicon oxide film peels off to give rise to particles that contaminate the inside of the reaction furnace.

Another disadvantage is that when a single-crystal silicon film with a low impurity concentration is grown on the silicon wafer for substrate which has a high concentration of impurity in the surface layer, misfit dislocation tends to occur in the single-crystal silicon film. This problem is due to the difference in lattice constant that results from difference in impurity concentration between the surface of the silicon wafer for substrate and the single-crystal silicon film to be grown. To address this problem, it is necessary to lower the boron concentration in the surface layer of the silicon wafer for substrate. A means for solution is disclosed in Japanese Patent Unexamined Publication No. 9-199380.

According to this Publication, the substrate having a concentration of $3E18$ atoms/cm$^3$ is heated at 1200° C. for 2 hours in an atmosphere of 50% hydrogen. However, substrates having a higher concentration need heat treatment longer than 2 hours if they are to produce the same effect as mentioned above. Unfortunately, heat treatment longer than 2 hours adversely affects the durability of the quartz furnace for hydrogen treatment.

SUMMARY OF THE INVENTION

It is an object of the present invention to provide a method for producing a silicon wafer for epitaxial substrate and a method for producing an epitaxial substrate, the methods being able to prevent autodoping and misfit dislocation that occur at the time of epitaxial growth in such a way that the concentration of impurity in the surface layer is reduced while the concentration of impurity inside the silicon wafer for substrate is kept at a high level which the highly doped one would have.

According to the present invention, the method for producing a silicon wafer for epitaxial substrate includes a first step of performing thermal oxidization on a silicon wafer containing boron atoms no less than $1E19$ atoms/cm$^3$, thereby forming a silicon oxide film on the surface of the silicon wafer, a second step of peeling off the silicon oxide film, and a third step of performing heat treatment on the silicon wafer, with the silicon oxide film peeled off, in a hydrogen atmosphere.

According to the present invention, the method for producing an epitaxial substrate includes a first step of performing thermal oxidization on a silicon wafer containing boron atoms no less than $1E19$ atoms/cm$^3$, thereby forming a silicon oxide film on the surface of the silicon wafer, a second step of peeling off the silicon oxide film, a third step of performing heat treatment on the silicon wafer, with the silicon oxide film peeled off, in a hydrogen atmosphere, and a fourth step of forming single-crystal silicon film on the silicon wafer which has undergone heat treatment.

The first step mentioned above should preferably be carried out in such a way that the silicon wafer is heated at 1000-1100° C. in an oxidizing atmosphere.

The third step mentioned above should preferably be carried out in such a way that the silicon wafer is heated at 1000-1200° C.

According to the present invention, it is possible to reduce the concentration of impurity in the surface layer of a silicon wafer for substrate more than before while keeping the concentration of impurity inside the silicon wafer for substrate at a high level equal to that of a highly doped one. Thus the methods according to the present invention yield a good silicon wafer for substrate and a good epitaxial substrate by preventing autodoping and misfit dislocation which otherwise occur at the time of epitaxial growth.

BRIEF DESCRIPTION OF THE DRAWINGS

Embodiments of the present invention will be described in detail based on the following figures, wherein.

DESCRIPTION OF THE PREFERRED EMBODIMENTS

The following describes in more detail with reference to the accompanied drawings the method for producing a silicon wafer for epitaxial substrate (simply referred to as a silicon wafer for substrate hereinafter) and the method for producing an epitaxial substrate according to the preferred embodiments of the present invention. Here, the silicon wafer for epitaxial substrate denotes a silicon wafer to be used as a substrate on which a single-crystal silicon film is grown by an epitaxial growing method.

Figure 1:
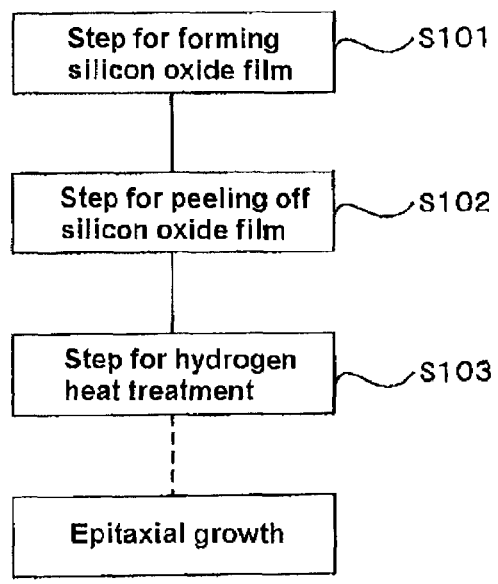
FIG. 1 is a flow chart showing steps in the method for producing a silicon wafer according to a preferred embodiment of the present invention.

FIG. 1 is a flow chart showing steps involved in the method for producing a silicon wafer for substrate.

The first step S101 is intended to form a silicon oxide film. It starts with slicing a silicon ingot into silicon wafers, mirror-polishing the surface of the wafers, and placing the finished silicon wafers in a reaction furnace.

For production of the silicon wafer for substrate, the embodiment shown in FIG. 1 employs a highly-doped silicon wafer which contains no less than 1E19 atoms/cm$^3$ of boron (B) as an impurity.

The reaction furnace to accommodate the silicon wafer holds an atmosphere of 100% oxygen. In the case of combustion oxidization, the atmosphere in the furnace is replaced by the one composed of hydrogen and oxygen (1:1) at a prescribed pressure. The silicon wafer placed in the reaction furnace undergoes thermal oxidization at 1000-1100° C.

Figure 2:
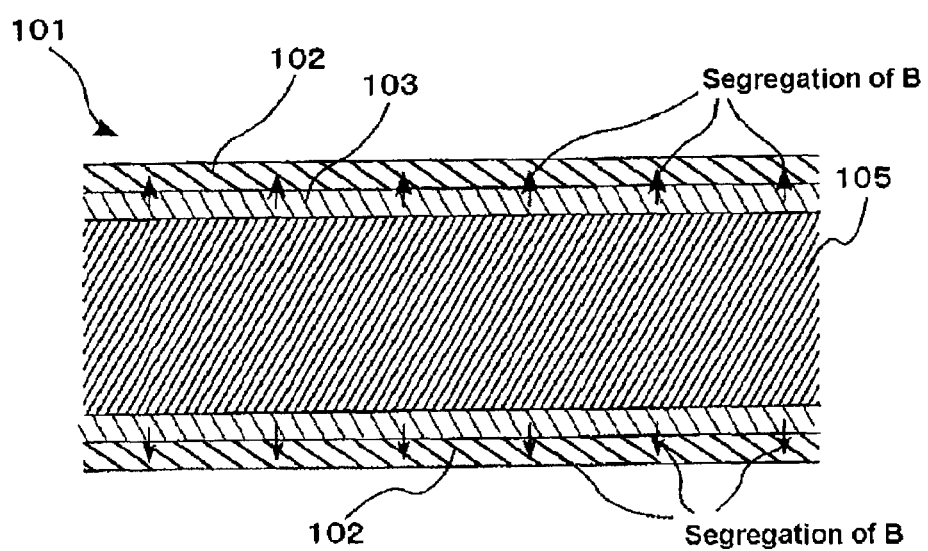
FIG. 2 is a schematic sectional view showing a silicon wafer which has passed Step S101 in the embodiment.

FIG. 2 is a schematic sectional view showing a silicon wafer 101 which has passed Step S101 mentioned above. As the result of Step S101, the surface of the silicon wafer 101 is coated with the silicon oxide film 102 shown in FIG. 2.

In general, boron contained in silicon tends to segregate from silicon into silicon oxide film when silicon is oxidized. As schematically indicated by arrows in FIG. 2, doped boron in the silicon wafer 101 segregates into the silicon oxide film 102. This decreases the concentration of boron in the interface (adjacent to silicon) between the silicon and the silicon oxide film 102 of the silicon wafer 101 down to 50-80% of the initial concentration before oxidization. As the result, the transition layer 103 is formed in the silicon wafer 101. In this transition layer 103, the concentration of boron gradually decreases (along a gentle slope) in going from the inside of the silicon wafer 101 to the interface between the silicon and the silicon oxide film 102 of the silicon wafer 101.

The next step S102 in the flow chart shown in FIG. 1 is to peel off the silicon oxide film 102 from the silicon wafer 101 by using BHF (buffered hydrofluoric acid, HF—NH$_4$F—H$_2$O) as etching solution in a batch-type wet treating apparatus. As the result, there is exposed the silicon surface layer in which the boron concentration has been reduced.

Figure 3:
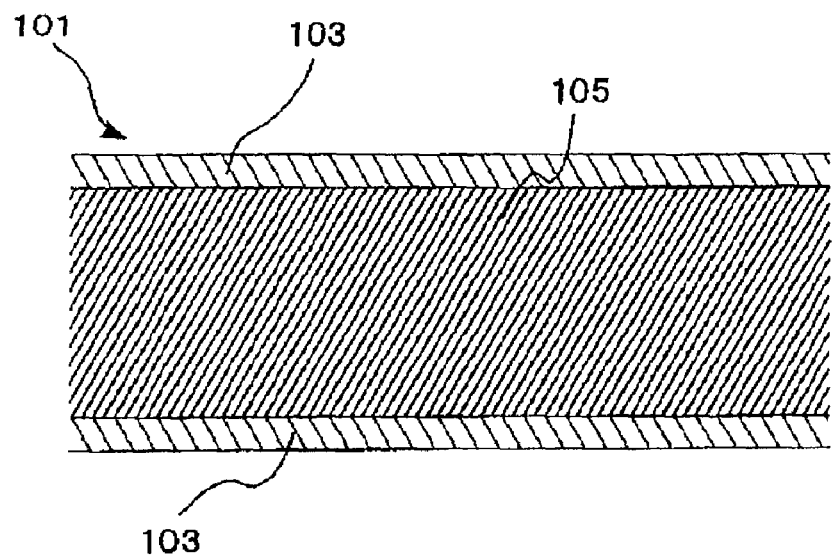
FIG. 3 is a schematic sectional view showing a silicon wafer which has passed Step S102 in the embodiment.

FIG. 3 is a schematic sectional view showing the silicon wafer 101 which has passed Step S102. It is to be noted that there remains the highly-doped region 105 which contains boron in a concentration more than 1E19 atoms/cm$^3$. This is because Step S102 is designed such that boron does not segregate into the silicon oxide film 102 from that part of the silicon wafer 101 which is deeper than the transition layer 103.

The next Step S103 in the flow chart shown in FIG. 1 is intended for hydrogen heat treatment. In this step, the silicon wafer 101 is heated at 1000-1200° C. in a reaction furnace filled with an atmosphere of 100% hydrogen at a prescribed pressure.

Figure 4:
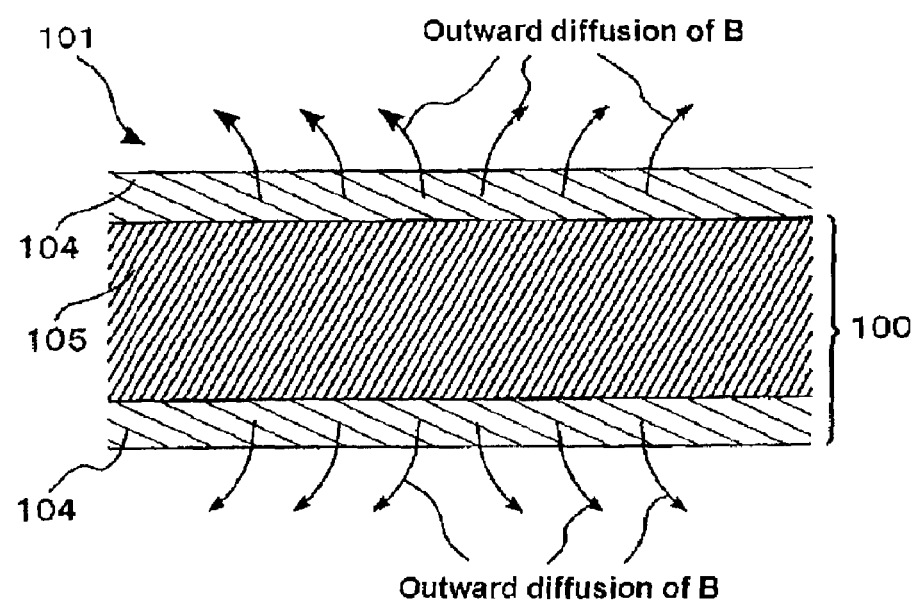
FIG. 4 is a schematic sectional view showing a silicon wafer which has passed Step S103 in the embodiment.

FIG. 4 is a schematic sectional view showing the silicon wafer 101 which has passed Step S103. As the result of Step S103, boron diffuses outward into the atmosphere from the surface of the silicon wafer 101, as indicated by arrows in FIG. 4.

Step S103 reduces further the boron concentration in the surface layer of the silicon wafer 101 because the boron concentration in the surface layer of the silicon wafer 101 has been previously reduced in Steps S101 and 5102. As the result, the boron concentration in the surface layer of the silicon wafer 101 is reduced to 1-10% of that in the highly doped region 105. Thus, there appears in the silicon wafer 101 the transition layer 104 in which the boron concentration is gradually decreases toward the surface layer from the depth of about 2-5 μm.

There remains the highly doped region 105 (more than 1E19 atoms/cm$^3$) in that part of the silicon wafer 101 which is deeper than the transition layer 104 because boron does not diffuse outward in Step S103.

As the result of Steps S101, 5102, and 5103, there is obtained the silicon wafer 100 for epitaxial substrate in which the boron concentration inside is as high as highly doped one but that in the surface layer is low.

The advantage of the foregoing steps is that a very little amount of boron diffuses outward when the silicon wafer 100 for epitaxial substrate undergoes epitaxial growth in the flow chart shown in FIG. 1. This prevents autodoping.

Thus, the silicon wafer 100 for epitaxial substrate is exempt from fluctuation in boron concentration in the single-crystal silicon film, which otherwise occurs due to autodoping at the time of epitaxial growth, even though no silicon oxide film is formed on the reverse side by CVD process. The absence of silicon oxide film on the reverse side avoids problems arising from it.

Figure 5:
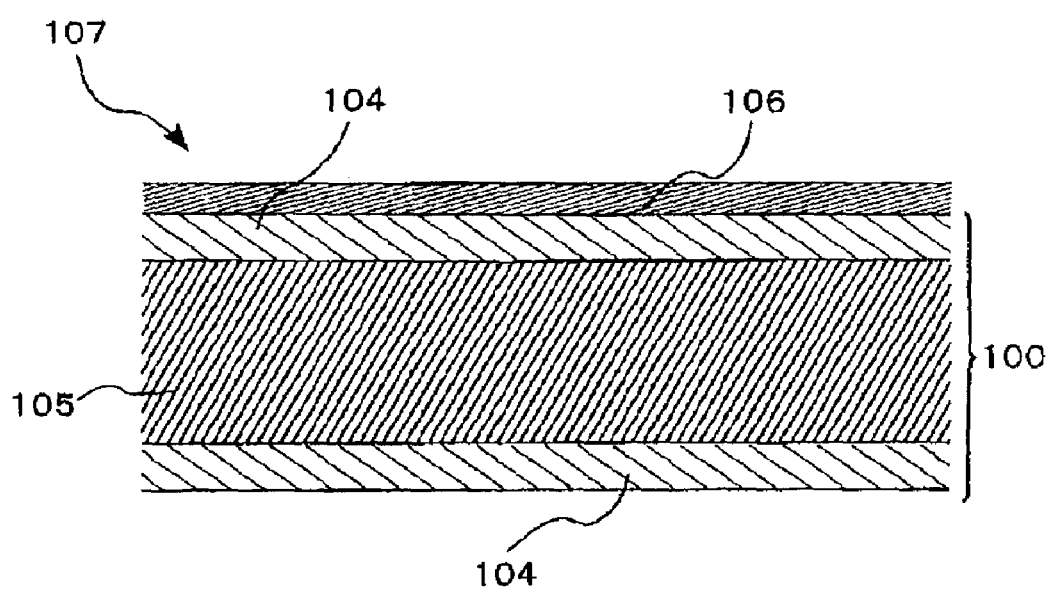
FIG. 5 is a schematic sectional view showing the epitaxial substrate which is produced from a silicon wafer for epitaxial substrate which has been produced by the steps of the embodiment.

FIG. 5 is a schematic sectional view showing the epitaxial substrate 107 which is produced from a silicon wafer 100 for epitaxial substrate which has been produced according to the embodiment of the present invention.

The epitaxial substrate 107 is produced by the step of epitaxial growth in the flow chart shown in FIG. 1. This step causes the single-crystal silicon film 106 doped with an impurity (such as boron or phosphorus) to grow on the surface of the silicon wafer 100 for epitaxial substrate. The silicon wafer 100 for epitaxial substrate which is produced according to this embodiment has a boron concentration in its surface layer such that it differs only slightly from the concentration of impurity in the single-crystal silicon film 106 resulting from epitaxial growth. This avoids a significant lattice strain in the interface with the single-crystal silicon film 106, which in turn prevents misfit dislocation from occurring in the single-crystal silicon film 106.

Since the epitaxial substrate 107 (shown in FIG. 5) has the single-crystal silicon film 106 grown thereon which is uniform in impurity concentration profile and limited in dislocations, it can be made into high-performance discrete devices in high yields.

The foregoing steps S101 and S102 according to this embodiment may be performed individually on a silicon wafer to produce the effect of reducing the boron concentration in the surface layer. However, the steps S101, S102, and 5103, which are performed sequentially, produce the effect of remarkably reducing the boron concentration in the surface layer of the silicon wafer for substrate. This embodiment is advantageous over the technique disclosed in Japanese Patent Unexamined Publication No. 9-199380 which includes only Step S103; it gives rise to an equal or better boron concentration profile by heat treatment with a comparatively low load.

Incidentally, if the order of the foregoing steps is changed such that Step S103 is followed by Steps S101 and S102, this embodiment will not produce the effect of remarkably reducing the boron concentration in the surface layer.

The foregoing is a description of the preferred embodiment. The present invention is not restricted to it but may be variously modified within the scope of the claims.

For example, Steps S101 and S102 may be carried out by using one reaction furnace or different ones suitable for individual steps. The former case saves space and cost because the reaction furnace can be used in common for production of silicon wafers.

On the other hand, using more than one reaction furnace offers the advantage that the silicon wafer is not adversely affected by residual by-products that might occur in each process.

The step S101 is designed such that the silicon wafer is oxidized by heating at 1000-1100° C. in a combustion atmosphere of hydrogen and oxygen (1:1). However, thermal oxidization may be accomplished under other conditions so long as boron segregates into the silicon oxide film to be formed. For example, thermal oxidization may be performed on a silicon wafer in a reaction furnace filled with 100% oxygen. Alternatively, thermal oxidization may be accomplished in two steps such that the foregoing combustion oxidization is followed by thermal oxidization in 100% oxygen.

The BHF etching solution used in Step S102 may be replaced by any other one capable of etching the silicon oxide film, such as DHF (dilute hydrofluoric acid or HF—$H_2O$) of desired concentration.

Although the foregoing step S103 is so designed as to use 100% hydrogen for the atmosphere in the reaction furnace, any atmosphere that contains other gas than hydrogen can be used so long as it permits boron to diffuse outward from the surface of the silicon wafer 101 being heated up to a prescribed temperature.

The foregoing embodiment specifies that the hydrogen treatment should be carried out at 1200° C. for 2 hours. However, this length of time may be reduced in actual operation because it has been established simply for comparison with the conventional technology. It is possible to control the profile of boron concentration to some extent by performing oxidization and hydrogen treatment under variously combined conditions.

The foregoing embodiment excludes the description of the method for producing the epitaxial substrate and the silicon wafer for epitaxial substrate and the construction and control of the process apparatus, which are not directly concerned with the present invention. However, they should be selected and used properly according to need.

The scope of the present invention embraces any method of producing a silicon wafer for epitaxial substrate so long as it possesses the elements of the present invention and it can be realized by modification by those who are skilled in the art.

The examples of the present invention will be described with reference to FIGS. 1 and 6.

EXAMPLE

A silicon wafer for epitaxial substrate was prepared according to the steps arranged in the flow chart shown in FIG. 1. Each step was carried out under the following conditions. After completion of each step, the silicon wafer for substrate was examined for the distribution of boron concentration by SIMS analysis. The results are shown in FIG. 6.
Condition of Step S101 to form the oxide film (or temperature in the reaction furnace): 1050° C.
Pressure in the reaction furnace: 760 Torr
Atmosphere in the reaction furnace: $H_2:O_2$=1:1
Duration of combustion oxidization plus treatment with 100% oxygen: 60 minutes
Condition of Step S102 to peel off the oxide film (or treating solution): BHF
Condition of Step S103 for hydrogen heat treatment (or temperature in the reaction furnace): 1200° C.
Pressure in the reaction furnace: 760 Torr
Atmosphere in the reaction furnace: $H_2$ 100%
Duration of treatment: 120 minutes Comparative Example 1

The procedure of Example excluding Step S103 was repeated for a sample of silicon wafer under the same conditions as Example. The treated sample was examined for the distribution of boron concentration. The results are shown in FIG. 6.

Comparative Example 2

The procedure of Example excluding Steps S101 and S102 was repeated for a sample of silicon wafer under the same conditions as Example. The treated sample was examined for the distribution of boron concentration. The results are shown in FIG. 6.

Comparative Example 3

The procedure of Example was repeated for a sample of silicon wafer under the same conditions as Example, except that the order of the steps was changed. That is, Step S103 was carried out first and then Steps S101 and 5102 were carried out. The treated sample was examined for the distribution of boron concentration. The results are shown in FIG. 6.

Figure 6:
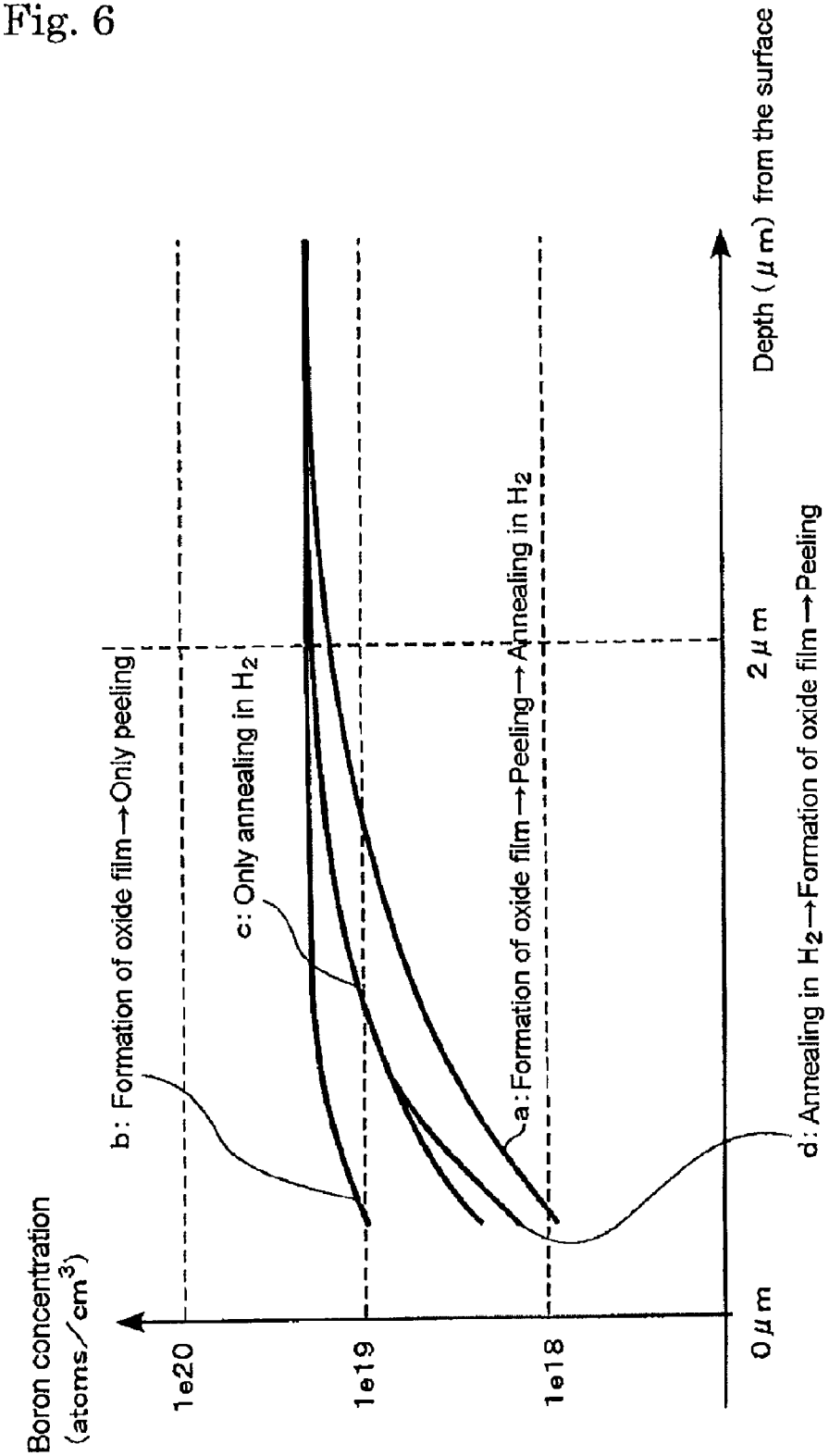
FIG. 6 is a graph showing the distribution of boron concentration measured in Example and Comparative Examples.

FIG. 6 is a graph showing the distribution of boron concentration in the silicon wafers for epitaxial substrate which was measured in Example and Comparative Examples 1 to 3. The ordinate represents the boron concentration (atoms/cm$^2$) and the abscissa represents the depth (μm) from the surface of the silicon wafer for epitaxial substrate.

Curve "a" in FIG. 6 represents the relationship between the boron concentration and the depth from the surface, which was observed in the silicon wafer for epitaxial substrate according to Example of the present invention. Curve "b" represents the distribution of boron concentration in the silicon wafer for epitaxial substrate according to Comparative Example 1. Curve "c" represents the distribution of boron concentration in the silicon wafer for epitaxial substrate according to Comparative Example 2. Curve "d" represents the distribution of boron concentration in the silicon wafer for epitaxial substrate according to Comparative Example 3.

It is noted from Curve "a" that the treatment according to Example of the present invention reduces the boron concentration from 2E19 atoms/cm$^3$ and above (in the highly doped region) to 1E18 atoms/sm$^3$ and below. It is also noted that the boron concentration gradually decreases in going toward the surface layer of the silicon wafer. In other words, the original boron concentration in the surface layer is reduced to 5% or less as the result of treatment.

It is noted from Curve "b" that the treatment according to Comparative Example 1 reduces the original boron concentration in the surface layer to 50%.

It is also noted from Curve "c" that the treatment according to Comparative Example 2 reduces the original boron concentration in the surface layer to 10%.

It is also noted from Curve "d" that the treatment according to Comparative Example 3 reduces the original boron concentration in the surface layer to 10%. This effect is almost the same as that of the treatment according to Comparative Example 2 (Curve "c").

It is concluded from the foregoing that Example according to the present invention is more effective than Comparative Examples 1 to 3 in greatly reducing the boron concentration in the surface layer of the silicon wafer 101. This implies that Example according to the present invention permits the production of a silicon wafer for epitaxial growth which is very little vulnerable to autodoping and misfit dislocation at the time of epitaxial growth.

What is claimed is:

1. A method for producing a silicon wafer for an epitaxial substrate, comprising:
   a first step of performing thermal oxidization on a silicon wafer containing boron atoms no less than 1E19 atoms/cm$^3$, thereby forming a silicon oxide film on a surface of the silicon wafer;
   a second step of peeling off the silicon oxide film by wet treating without hydrogen heat treatment; and
   a third step of performing heat treatment on the silicon wafer in a hydrogen atmosphere, wherein the silicon oxide film was previously peeled off during the second step,
   wherein during the first step the thermal oxidization is performed on both surfaces of the silicon wafer, and during the second step the silicon oxide film is peeled off with regard to both surfaces of the silicon wafer.

2. The method according to claim 1, wherein the first step is carried out in such a way that the silicon wafer is heated at 1000-1100° C. in an oxidizing atmosphere.

3. The method according to claim 2, wherein the third step is carried out in such a way that the silicon wafer is heated at 1000-1200° C.

4. The method according to claim 1, wherein the third step is carried out in such a way that the silicon wafer is heated at 1000-1200° C.

5. The method according to claim 1, wherein buffered hydrofluoric acid is used for performing the wet treating.

6. A method for producing an epitaxial substrate, comprising:
   a first step of performing thermal oxidization on a silicon wafer containing boron atoms no less than 1E19 atoms/cm$^3$, thereby forming a silicon oxide film on a surface of the silicon wafer;
   a second step of peeling off the silicon oxide film by wet treating without hydrogen heat treatment;
   a third step of performing heat treatment on the silicon wafer in a hydrogen atmosphere, wherein the silicon oxide film was previously peeled off during the second step; and
   a fourth step of forming single-crystal silicon film on the silicon wafer which has undergone heat treatment
   wherein during the first step the thermal oxidization is performed on both surfaces of the silicon wafer, and during the second step the silicon oxide film is peeled off with regard to both surfaces of the silicon wafer.

7. The method according to claim 6, wherein the first step is carried out in such a way that the silicon wafer is heated at 1000-1100° C. in an oxidizing atmosphere.

8. The method according to claim 7, wherein the third step is carried out in such a way that the silicon wafer is heated at 1000-1200° C.

9. The method according to claim 6, wherein the third step is carried out in such a way that the silicon wafer is heated at 1000-1200° C.

10. The method according to claim 6, wherein the buffered hydrofluoric acid is used for performing the wet treating.

* * * * *